(12) United States Patent
Hosseini et al.

(10) Patent No.: US 9,159,701 B2
(45) Date of Patent: Oct. 13, 2015

(54) METHOD OF MANUFACTURING A CHIP PACKAGE, CHIP PACKAGE, METHOD OF MANUFACTURING A CHIP ASSEMBLY AND CHIP ASSEMBLY

(71) Applicant: Infineon Technologies AG, Neubiberg (DE)

(72) Inventors: Khalil Hosseini, Weihmichl (DE); Joachim Mahler, Regensburg (DE); Franz-Peter Kalz, Regensburg (DE); Joachim Voelter, Berlin (DE); Ralf Wombacher, Burglengenfeld (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/028,577

(22) Filed: Sep. 17, 2013

(65) Prior Publication Data
US 2015/0076672 A1    Mar. 19, 2015

(51) Int. Cl.
| | |
|---|---|
| H01L 23/52 | (2006.01) |
| H01L 21/60 | (2006.01) |
| H01L 23/48 | (2006.01) |
| H01L 21/50 | (2006.01) |
| H01L 21/56 | (2006.01) |
| H01L 23/00 | (2006.01) |
| H01L 23/495 | (2006.01) |
| H01L 23/492 | (2006.01) |
| H01L 23/498 | (2006.01) |

(52) U.S. Cl.
CPC .............. *H01L 24/97* (2013.01); *H01L 23/492* (2013.01); *H01L 23/49575* (2013.01); *H01L 23/49811* (2013.01); *H01L 2924/1305* (2013.01); *H01L 2924/13055* (2013.01); *H01L 2924/13091* (2013.01)

(58) Field of Classification Search
CPC ................. H01L 2224/97; H01L 2924/15311; H01L 2224/32145; H01L 2224/94; H01L 2224/96; H01L 24/97; H01L 25/0657; H01L 2224/82; H01L 2224/04105; H01L 2224/03; H01L 2224/16145; H01L 2225/1035; H01L 2224/19; H01L 21/56
USPC ........... 257/660–670, 774–784; 438/104–114
See application file for complete search history.

(56) References Cited

U.S. PATENT DOCUMENTS

| | | | |
|---|---|---|---|
| 7,612,457 | B2 | 11/2009 | Mahler et al. |
| 7,847,375 | B2 | 12/2010 | Mahler et al. |

(Continued)

FOREIGN PATENT DOCUMENTS

DE    102008025451 B4    4/2011

OTHER PUBLICATIONS

"Eigenschaften Parylene", Modern Plastics Enclyclopedia, 1968.

*Primary Examiner* — Marcos D. Pizarro
*Assistant Examiner* — Nelson Garces

(57) ABSTRACT

A method of manufacturing a chip package is provided. The method may include electrically contacting at least one first chip, the first chip including a first side and a second side opposite the first side, with its second side to an electrically conductive carrier. An insulating layer is formed over at least a part of the electrically conductive carrier and over at least a part of the first side of the chip. At least one second chip is arranged over the insulating layer. An encapsulating material is formed over the first chip and the second chip. Electrical contacts are formed through the encapsulation material to at least one contact of the at least one first chip and to at least one contact of the at least one second chip.

10 Claims, 3 Drawing Sheets

(56) References Cited

U.S. PATENT DOCUMENTS

| | | |
|---|---|---|
| 7,868,465 B2 * | 1/2011 | Otremba et al. .............. 257/783 |
| 7,994,646 B2 | 8/2011 | Mahler et al. |
| 2011/0278707 A1 * | 11/2011 | Chi et al. ...................... 257/676 |
| 2012/0032340 A1 * | 2/2012 | Choi et al. .................... 257/774 |
| 2012/0299191 A1 * | 11/2012 | Camacho ....................... 257/774 |

* cited by examiner

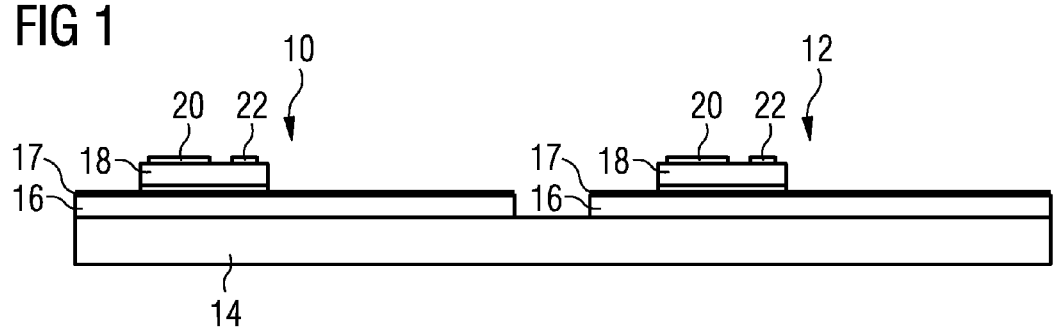
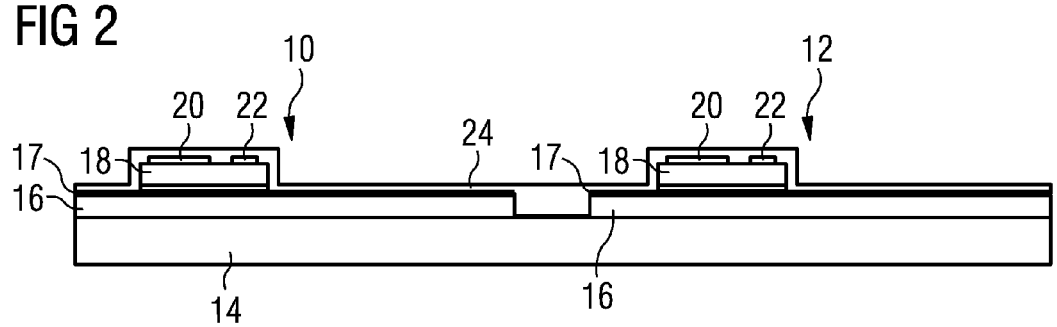
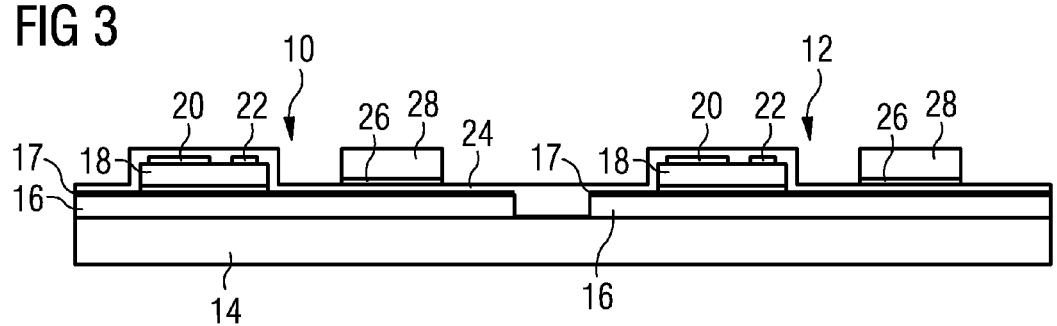

METHOD OF MANUFACTURING A CHIP PACKAGE, CHIP PACKAGE, METHOD OF MANUFACTURING A CHIP ASSEMBLY AND CHIP ASSEMBLY

TECHNICAL FIELD

Various embodiments relate generally to a method of manufacturing a chip package, a chip package, a method of manufacturing a chip assembly and a chip assembly.

BACKGROUND

In a chip package several chips may be arranged side by side or chip by chip on a carrier. The chips may be electrically coupled to the carrier. In such a chip package the electric isolation of one chip to another chip may be important for the functionality of the chips and in general the chip package. The chips may have a given distance to each other and/or may be separated by isolating material in order to provide a proper isolation of the chips. In order to provide a better isolation the distances between the chips are increased. For example, in electronic systems as a DC-DC converter which comprises for example two power chips and often an integrated circuit chip (IC) as a logic driver component next to each other the distances between the power chips and the IC is usually relative big. However, with increasing distance between the chips the size of the system, for example the chip package, increases. Further, when using an electrically conductive carrier, for example a lead frame, an inaccuracy of the arrangement of the chips on the carrier and/or an inaccurate thickness of an isolation layer between one of the chips and the carrier, for example if the corresponding chip, for example the IC, is adhered to the carrier with the help of an insulating adhesive, may lead to the following problems: Inhomogeneous amounts of adhesive, a creeping of the adhesive up the chip, and/or insufficient adhering of the adhesive on the carrier may lead to an additional process step for increasing the adhering of the adhesive layers. Further, the adhesive may not adhere properly at the side walls of the chip. This may lead to problems when one of the chips, for example the power chip, is connected to the carrier by diffusion soldering, because the material of the carrier, for example copper, may diffuse through the material, for example silicon, of the chip and may form CuSi at the side walls of the chip. This may lead to an electrical malfunction of the chip. Further, there may be a solder-bleed-out at the chip and the adhesive may not adhere to the solder-bleed-out.

SUMMARY

A method of manufacturing a chip package is provided. The method may include electrically contacting at least one first chip, the first chip including a first side and a second side opposite the first side, with its second side to an electrically conductive carrier. An insulating layer is formed over at least a part of the electrically conductive carrier and over at least a part of the first side of the chip. At least one second chip is arranged over the insulating layer. An encapsulating material is formed over the first chip and the second chip. Electrical contacts are formed through the encapsulation material to at least one contact of the at least one first chip and to at least one contact of the at least one second chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows an embodiment of a first chip package and a second chip package in a first process stage during a method for manufacturing the first and, respectively, the second chip package;

FIG. 2 shows an embodiment of a first chip package and a second chip package in second process stage during a method for manufacturing the first and, respectively, the second chip package;

FIG. 3 shows an embodiment of a first chip package and a second chip package in a third process stage during a method for manufacturing the first and, respectively, the second chip package;

DESCRIPTION

Figure 4:
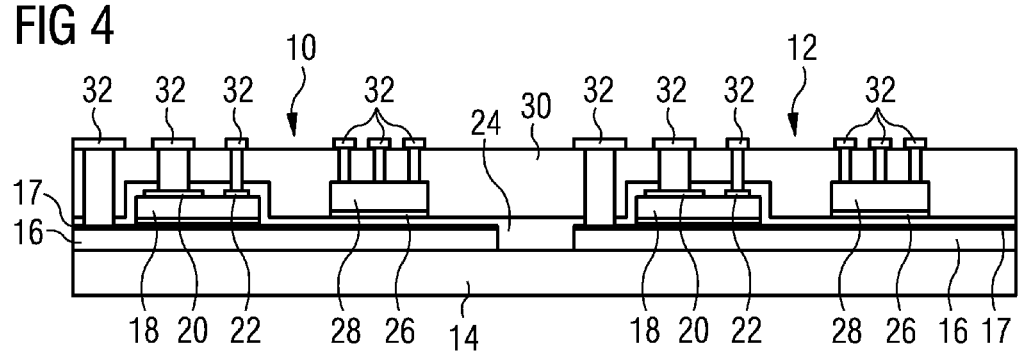
FIG. 4 shows an embodiment of a first chip package and a second chip package in a fourth process stage during a method for manufacturing the first and, respectively, the second chip package.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In various embodiments a method for manufacturing a chip package may include electrically contacting at least one first chip, the first chip including a first side and a second side opposite the first side, with its second side to an electrically conductive carrier. An insulating layer may be formed over at least a part of the electrically conductive carrier and over at least a part of the first side of the chip. At least one second chip may be arranged over the insulating layer. An encapsulating material may be formed over the first chip and the second chip. Electrical contacts may be formed through the encapsulation material to at least one contact of the at least one first chip and to at least one contact of the at least one second chip.

The insulating layer over the first chip and under the second chip enables to arrange the second chip relative close and with a relative small distance to the first chip. This may contribute to a small size chip package. The insulating layer provides a proper contact surface for an encapsulating material for encapsulating the chip package and/or for an adhesive for fixing the second chip to the carrier. This increases the adhesive effect of the encapsulating material and, respectively, the adhesive. The insulating material may be arranged such that side walls of the first chip, the side walls extending from the first side of the first chip to the second side of the first chip, are encapsulated what contributes to that that no or only less material of the carrier may creep up the side walls of the first chip. This may contribute to a proper functionality of the chip package over a long lifetime. In various embodiments there may be two, three or more first chips each including a first side and a second side opposite the first side, wherein the corresponding first chips are electrically contacted with their corresponding second sides to the electrically conductive carrier.

In various embodiments, the second chip may be arranged next to the first chip.

In various embodiments, the second chip may be arranged over the first chip.

In various embodiments, the insulating layer may be formed over the whole first side of the first chip.

In various embodiments, the whole second chip may be arranged over the insulating layer.

In various embodiments, the thickness of the insulating layer over the carrier and the thickness of the insulating layer over the first chip may be the same or in the same range, wherein the range may be defined by the thickness of one of the insulating layers and by a deviation smaller than for example 10%, 5%, or 1% from this thickness for the thickness of the other insulation layer.

In various embodiments, the insulating layer may be formed by vapour deposition.

In various embodiments, the insulating layer may be formed by chemical vapour deposition.

In various embodiments, the insulating material for forming the insulating layer may be in its liquid phase when the insulating layer is formed.

In various embodiments, the insulating material includes a ceramic and/or a polymer.

In various embodiments, a chip package is provided. The chip package may include an electrically conductive carrier. At least one first chip, the first chip including a first side and a second side opposite the first side, may be electrically contacted with its second side to the electrically conductive carrier. An insulating layer may be formed over at least a part of the electrically conductive carrier and over at least a part of the first side of the chip. At least one second chip may be arranged over the insulating layer. An encapsulating material may be formed over the first chip and the second chip. Electrical contacts may extend through the encapsulation material to at least one contact of the at least one first chip and to at least one contact of the at least one second chip. In various embodiments there may be two, three or more first chips each including a first side and a second side opposite the first side, wherein the corresponding first chips are electrically contacted with their corresponding second sides to the electrically conductive carrier.

In various embodiments, the second chip may be arranged next to the first chip.

In various embodiments, the second chip may be arranged over the first chip.

In various embodiments, the insulating layer may be formed over the whole first side of the first chip.

In various embodiments, the whole second chip may be arranged over the insulating layer.

In various embodiments, a thickness of the insulating layer over the carrier and a thickness of the insulating layer over the first chip may be the same, approximately the same or in the same range, wherein the same range may be defined by the order of magnitude of one of the thicknesses of the insulation layers. In other words, the thicknesses of the insulation layers may have the same order of magnitude.

In various embodiments, the material of the insulating layer comprises a ceramic and/or a polymer.

In various embodiments, the first chip may be a power chip.

In various embodiments, the second chip may be an IC.

In various embodiments, a method of manufacturing a chip assembly is provide. The method may include arranging at least one first chip, the first chip including a first side and a second side opposite the first side, with its second side on a carrier and electrically coupling the first chip with the carrier. A coating may be formed over at least a part of the carrier and over at least a part of the first side of the chip with the coating electrically insulating the coated parts of the carrier and of the first chip. At least one second chip may be arranged over the coating. Optionally, an encapsulation may be formed over the first chip and the second chip.

The coating over the first chip and under the second chip may enable to arrange the second chip relative close and with a relative small distance to the first chip. This may contribute to a small size chip package. The coating provides a proper contact surface for an encapsulating material for encapsulating the chip package and/or for an adhesive for fixing the second chip to the carrier. This may increase the adhesive effect of the encapsulating material and, respectively, the adhesive. The insulating material of the coating may be arranged such that side walls of the first chip, the side walls extending from the first side of the first chip to the second side of the first chip, are coated what may contribute to that that no or only less material of the carrier may creep up the side walls of the first chip. This may contribute to a proper functionality of the chip package over a long lifetime. In various embodiments there may be two, three or more first chips each including a first side and a second side opposite the first side, wherein the corresponding first chips are arranged on the electrically conductive carrier and are electrically contacted with their corresponding second sides to the electrically conductive carrier.

In various embodiments, the second chip may be arranged besides the first chip in a direction parallel to the first side of the first chip.

In various embodiments, the second chip may be arranged on the coating over the first chip.

In various embodiments, the coating may be formed over the whole first side of the first chip.

In various embodiments, the second chip has a first side of the second chip and a second side of the second chip, wherein the second chip may be arranged on the coating with its second side and wherein the whole second side of the second chip may be in contact with the coating.

In various embodiments, a thickness of the coating over the carrier may be the same like a thickness of the coating over the first chip.

In various embodiments, the coating may be formed by vapour deposition.

In various embodiments, the coating may be formed by chemical vapour deposition.

In various embodiments, the material for forming the coating may be in its liquid phase when the coating is formed.

In various embodiments, the coating may include a ceramic and/or a polymer.

In various embodiments, a chip assembly is provided. The chip assembly may include a carrier and at least one first chip, the first chip including a first side and a second side opposite the first side, with its second side being arranged on the carrier and with the first chip being electrically contacted with the carrier. A coating may be formed over at least a part of the carrier and over at least a part of the first side of the chip. The coating may electrically isolate the corresponding parts of the carrier and the first chip. At least one second chip may be arranged over the coating. Optionally, an encapsulation may be formed over the first chip and the second chip. In various embodiments there may be two, three or more first chips each including a first side and a second side opposite the first side, wherein the corresponding first chips are arranged on the electrically conductive carrier and are electrically contacted with their corresponding second sides to the electrically conductive carrier.

In various embodiments, the second chip may be arranged besides the first chip in a direction parallel to the first side of the first chip.

In various embodiments, the second chip may be arranged over the first chip.

In various embodiments, the coating may be formed over the whole first side of the first chip.

In various embodiments, the second chip has a first side of the second chip and a second side of the second chip, wherein the second chip may be arranged on the coating with its second side and wherein the whole second side of the second chip may be in contact with the coating.

In various embodiments, a thickness of the coating over the carrier may be the same, approximately the same or similar at least similar than a thickness of the coating over the first chip.

In various embodiments, the coating may include an inorganic material, a ceramic and/or a polymer.

In various embodiments, the first chip may be a power chip.

In various embodiments, the second chip may be an integrated circuit (IC).

FIG. 1 shows an embodiment of a first chip package 10 and a second chip package 12 in a first process stage during a method for manufacturing the first and, respectively the second chip package 10, 12. The first chip package 10 and the second chip package 12 may form a first chip assembly and, respectively, a second chip assembly. In the first process stage shown in FIG. 1, a carrier tape 14 may already be provided, the carrier tape 15 carrying one electrically conductive carrier for each chip package 10, 12. The carrier may include a substrate 16 and/or an electrically conductive coating 17 on the substrate 16. Alternatively, the carrier and e.g. the substrate 16 and/or the electrically conductive coating 17 may be made from one piece. The substrate 16 may be electrically conductive or may be electrically isolating. For example, the substrate 16 may include an electrically conductive material or may consist of an electrically conductive material. The electrically conductive coating 17 may for example be a conductive layer on the substrate 16. The electrically conductive coating 17 may cover the whole substrate 16 or may only cover a part of the substrate 16. The electrically conductive carrier may be a lead frame, for example a copper lead frame.

At least one first chip 18 is arranged on the carrier of each chip package 10, 12. The first chip 18 may comprise a first side and a second side opposite the first side. The first chip 18 may be arranged and/or electrically contacted with its second side to the electrically conductive carrier, for example with the electrically conductive coating 17. The first chip 18 may include a first electrical contact 20 and a second electrical contact 22. The first chip 18 may include one, two or more electrical contacts (not shown) on its second side facing the carrier. The first chip 18 may be arranged on the carrier by diffusion soldering. For example, the first chip 19 may include an AuSn-layer on its second side which may react with the material of the carrier, for example the copper of the copper lead frame, under high temperature and/or high pressure such that the first chip 18 is fixed to the carrier. The high temperature may be in a range of 200° to 400° Celsius, for example at approximately 300° Celsius. The first chip 18 may be a power chip, for example a CoolMOS (Cool metal oxide semiconductor), a MOSFET (Metal oxide semiconductor field effect transistor) or an IGBT (Insulated gate bipolar transistor). In various embodiments at least one of the chip packages 10, 12 may comprise two, three or more first nips 18 being arranged on the electrically conductive carrier and being electrically contacted to the electrically conductive carrier.

The first and the second chip package 10, 12 are connected via the carrier tape 14 and thus form a chip package array. Alternatively, there may be only one chip package 10 or further chip packages.

FIG. 2 shows an embodiment of the first chip package 10 and the second chip package 12 in a second process stage during the method for manufacturing the first and, respectively, the second chip package 10, 12 after the first process stage as shown in FIG. 1. In the second process stage as shown in FIG. 2 an insulating layer 24 may be formed over at least a part of the carrier, for example the electrically conductive carrier, and over at least a part of the first side of the first chip 18. The insulating layer 24 may form a coating, e.g. an electrically insulating coating. The insulating layer 24 may be formed over the whole first side of the first chip 18. For example, the insulating layer 24 covers the whole first side of the first chip 18 and/or the whole carrier except for the area in which the first chip 18 is arranged. Alternatively, only a part of the first chip 18 and/or only a part of the carrier may be covered by the insulating layer 24. A thickness of the insulating layer 24 over the carrier and a thickness of the insulating layer 24 over the first chip 18 may be the same. For example, the insulating layer 24 over the carrier and over the first chip 18 may be formed in a single process such that the thickness of the insulating layer 24 is homogeneous, approximately homogeneous or quite homogeneous. A thickness of the insulating layer may be in a range from 0.2 to 100 μm, for example in a range from 0.5 to 20 μm, for example in a range from 1 to 5 μm.

The insulating layer 24 may be formed by vapour deposition. The insulating layer 24 may be formed by chemical vapour deposition (CVD). Alternatively, the insulating layer 24 may be formed by physical vapour deposition (PVD). Alternatively, the insulating layer 24 may be formed by spin coating, by sputtering or by pyrolytic deposition, for example from silane and/or silicon dioxide. The insulating material for forming the insulating layer 24 may be in its gaseous phase and/or its liquid phase when the insulating layer 24 is formed.

The material of the insulating layer 24 may include an inorganic material and/or a ceramic and/or a polymer. For example, the insulating material of the insulating layer 24 may include an inorganic ceramic as for example silicon nitride, silicon dioxide, and/or one or more layers including carbon, for example an amorphous carbon layer for example being modified by oxygen, silicon, and/or hydrogen, for example an a-C:H:Si:O-layer. This may be advantageous, because of a high insulation strength and a very low permeability against moisture of the insulating layer, and/or because an adaption of the coefficient of thermal expansion of the material of the insulation layer 24 to the chips 18, 28 is possible. Alternatively, the insulating material may include a polymer as parylene, for example a poly para-xylylene polymere and/or parylene N, parylene C, parylene D, or epoxides or acrlyates or silicones or mixtures thereof. This may be advantageous, because then the insulating layer 24 may be formed at or near by room temperature, because thick layers may be formed, for example up to 50 µm, for example up to 100 µm, for example up to 200 µm, and/or because an elastic buffer layer may be formed by the insulating layer 24.

The insulating layer 24 functions as an electric isolation of the carrier and the first chip 18. Additionally, the insulating layer 24 may function as a diffusion barrier against copper from the carrier, e.g. the lead frame. Further, the insulating material may be chosen such that in a later step an encapsulation material may properly adhere to the insulation layer 24.

FIG. 3 shows an embodiment of the first chip package 10 and the second chip package 12 in a third process stage during the method for manufacturing the first and, respectively, the second chip package 10, 12, after the second process stage as shown in FIG. 2. In the third process stage as shown in FIG. 3, at least one second chip 28 is arranged over the insulating layer 24. For example, the second chip 28 may be arranged directly on the insulating layer 24. The second chip may be arranged on the insulating layer 24 by an adhesive 26, for example by a lamination process, by transfer molding, by transfer molding, or by a casting compound. The material of the adhesive 26 for fixing the second chip 28 to the insulating layer 24 may be electrically conductive or electrically isolating. The adhesive 26 may include silver particles, for example a high amount of silver particles.

The second chip 28 may be arranged next to the first chip 18. For example, the second chip 28 may be arranged next to the first chip 18 in a direction parallel to the first and/or the second side of the first chip 18 and having a given distance to the first chip 18. The whole second chip 28 may be arranged over the insulating layer 24. In other words, the insulating layer 24 may extend under the whole second chip 28. For example, the second chip 28 may include a first side of the second chip 28 and a second side of the second chip 28 and the second side of the second chip 28 may be fully or partly in direct contact with the insulating layer 24. The second chip 28 may include electrical contacts (not shown) of the second chip 28. The electrical contacts of the second chip 28 may be arranged at the first side of the second chip 28, facing away from the carrier.

The second chip 28 may be an integrated circuit (IC). The IC may be a Control Chip. The IC may include a housing (not shown). For example, the IC may be encapsulated such that the housing is formed (not shown).

FIG. 4 shows an embodiment of the first chip package 10 and the second chip package 12 in a fourth process stage during the method for manufacturing the first and, respectively, the second chip package 10, 12, after the third process stage as shown in FIG. 3. In the fourth process stage as shown in FIG. 4, an encapsulating material 30 may be formed over the first chip 18 and the second chip 28. The encapsulating material 30 may form an encapsulation which encapsulates the chips 18, 28 and the insulating layer 24. Further, the encapsulating material 30 may be formed over the insulating layer 24. The second chip 28 is encapsulated at its second side by the insulating layer 24 and at its first side and at the sides between its first and its second side by the encapsulating material 30. The encapsulating material 30 may be arranged by lamination, molding, for example transfer molding or injection molding, by spin coating, or by printing.

Electrical contacts 32 may be formed through the encapsulation material 30 to at least one electrical contact 20, 22 of the at least one first chip 18 and to at least one electrical contact of the at least one second chip 28. The electrical contacts 32 may be formed by forming holes in the encapsulation material 30, for example by drilling, e.g. laser or mechanical drilling, or by etching, and by inserting electrically conductive material, for example a metal, for example copper, silver or gold, into the holes.

Figure 5:
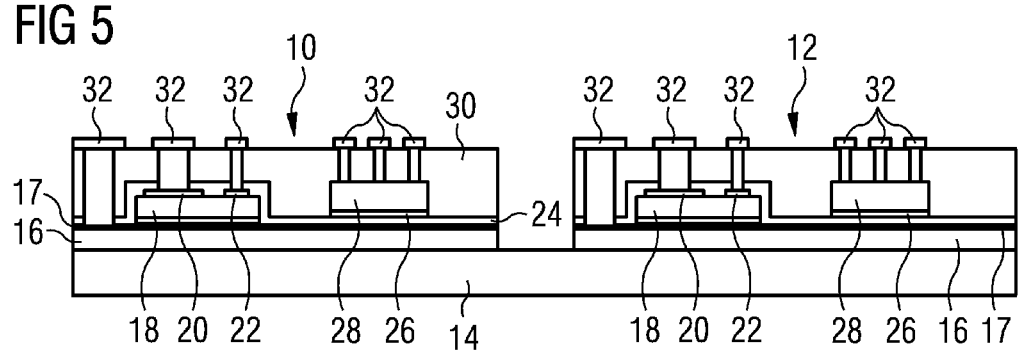
FIG. 5 shows an embodiment of a first chip package and a second chip package in a fifth process stage during a method for manufacturing the first and, respectively, the second chip package.

FIG. 5 shows an embodiment of the first chip package 10 and the second chip package 12 in a fifth process stage during the method for manufacturing the first and, respectively, the second chip package 10, 12, after the fourth process stage as shown in FIG. 4. In the fifth process stage as shown in FIG. 5, the first chip package 10 and the second chip package 12 may be separated from each other, for example by cutting or sawing.

Figure 6:
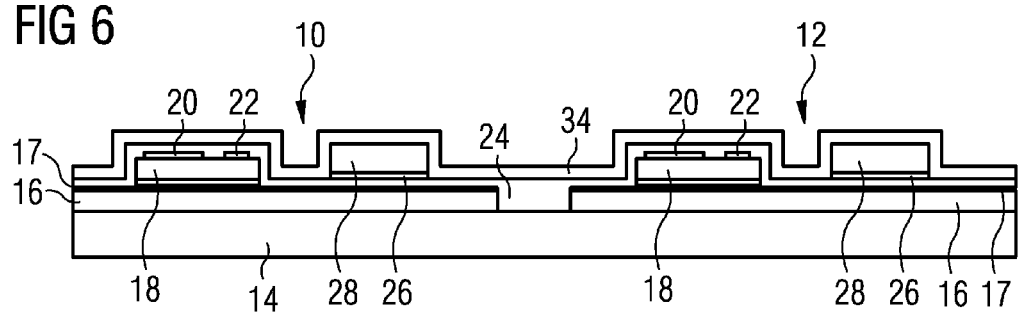
FIG. 6 shows an embodiment of a first chip package and a second chip package in a sixth process stage during a method for manufacturing the first and, respectively, the second chip package.

FIG. 6 shows an embodiment of the first chip package 10 and the second chip package 12 in a sixth process stage during the method for manufacturing the first and, respectively, the second chip package 10, 12, after the third process stage as shown in FIG. 3. In the sixth process stage as shown in FIG. 6, a second insulating layer 34 may be formed over the insulating layer 24 and the second chip 28. The second insulating layer 34 may cover the whole insulating layer 24 and/or the first chip 18. The second insulating layer 34 may enable to electrically isolate the second chip 28. This may enable to arrange one, two or more further chips over the second chip 28. Further, the second insulating layer 34 may additionally protect the chips 18, 28 against harmful physical or chemical external influences as impacts and/or oxygen and/or humidity. The second chip 28 is encapsulated by the insulating layer 24 at its second side and by the second insulating layer 34 at its first side and at the sides between its first and its second side.

The second insulating layer 34 may form a coating, e.g. an electrically insulating coating. The second insulating layer 34 may be formed over the whole first side of the second chip 28. For example, the second insulating layer 34 covers the whole first side of the second chip 28. Alternatively, only a part of the second chip 28 may be covered by the second insulating layer 34. A thickness of the second insulating layer 34 over the first insulating layer 24 and a thickness of the second insulating layer 34 over the second chip 28 may be the same, approximately the same or in the same order of magnitude. For example, the second insulating layer 34 over the first insulating layer 24 and over the second chip 28 may be formed in a single process such that the thickness of the second insulating layer 34 is homogeneous, approximately homogeneous or quite homogeneous. A thickness of the second insulating layer 34 may be in a range from 0.2 to 100 µm, for example in a range from 0.5 to 20 µm, for example in a range from 1 to 5 µm.

The second insulating layer 34 may be formed by vapour deposition. The second insulating layer 34 may be formed by chemical vapour deposition (CVD). Alternatively, the second insulating layer 34 may be formed by physical vapour deposition (PVD). Alternatively, the second insulating layer 34 may be formed by spin coating, by sputtering or by pyrolytic deposition, for example from silane and/or silicon dioxide. The insulating material for forming the second insulating layer 34 may be in its gaseous phase and/or its liquid phase when the second insulating layer 34 is formed.

The material of the second insulating layer 34 may include an inorganic material and/or a ceramic and/or a polymer. For example, the insulating material of the second insulating layer 34 may include an inorganic ceramic as for example silicon nitride, silicon dioxide, and/or one or more layers including carbon, for example an amorphous carbon layer for example being modified by oxygen, silicon, and/or hydrogen, for example an a-C:H:Si:O-layer. This may be advantageous, because of a high insulation strength and a very low permeability against moisture of the insulating layer, and/or because an adaption of the coefficient of thermal expansion of the material of the second insulation layer 34 to the chips 18, 28 is possible. Alternatively, the insulating material may include a polymer as parylene, for example a poly paraxylylene polymere and/or parylene N, parylene C, parylene D, or epoxides or acrylates or silicones or mixtures thereof. This may be advantageous, because then the second insulating layer 34 may be formed at or near by room temperature, because thick layers may be formed, for example up to 50 µm, for example up to 100 µm, for example up to 200 µm, and/or because an elastic buffer layer may be formed by the second insulating layer 34.

The second insulating layer 34 may function as an electric isolation of the second chip 28. Additionally, the second insulating layer 34 may function as a diffusion barrier against copper from the carrier, e.g. the lead frame. Further, the insulating material may be chosen such that in a later step an encapsulation material may properly adhere to the second insulation layer 34.

Figure 7:
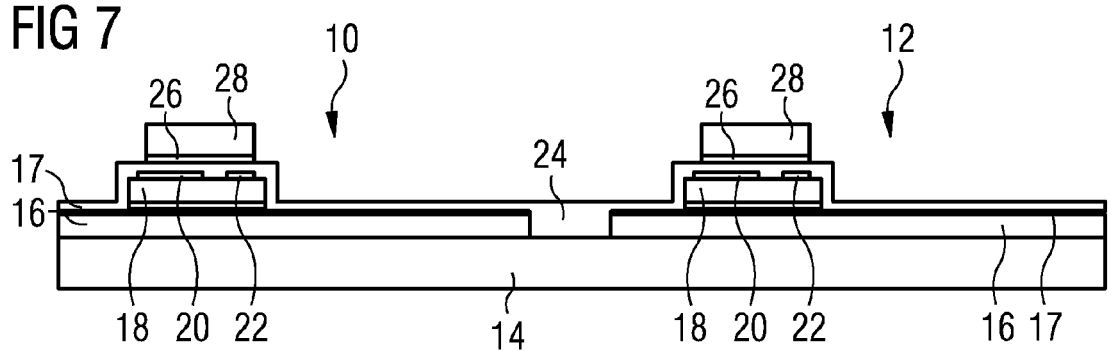
FIG. 7 shows an embodiment of a first chip package and a second chip package in a seventh process stage during a method for manufacturing the first and, respectively, the second chip package.

FIG. 7 shows an embodiment of the first chip package 10 and the second chip package 12 in a seventh process stage during the method for manufacturing the first and, respectively, the second chip package 10, 12, after the second process stage as shown in FIG. 2. In the seventh process stage as shown in FIG. 7, the second chip 28 may be arranged over the first chip 18. For example, the second chip 28 may be arranged on the insulating layer 24 on the first chip 18. Thus, the second chip 28 may be arranged away from the first chip 18 in a direction perpendicular to the first and/or the second side of the first chip 18, wherein the insulating layer 24 separates and isolates the first chip 18 from the second chip 28.

Figure 8:
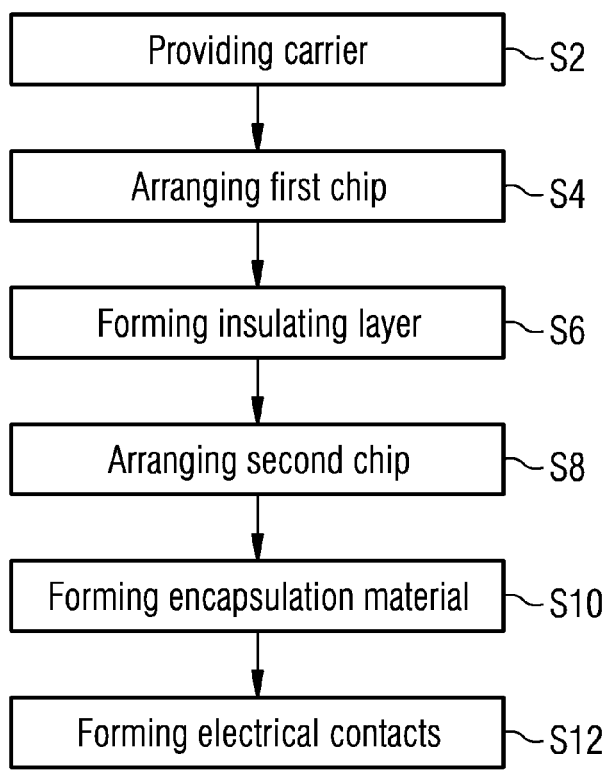
FIG. 8 shows a flow chart of an embodiment of a method for manufacturing a chip package.

FIG. 8 shows a flow chart of an embodiment of a method for manufacturing a chip package, for example the first chip package 10 or the second chip package 12. The method for manufacturing the chip package may be a method for manufacturing a chip assembly.

In S2, a carrier may be provided. For example, the carrier may be formed. The carrier may include a substrate 16 and an electrically conductive coating 17. The carrier may be an electrically conductive carrier. The carrier may be a lead frame. The electrically conductive carrier may include copper or may consist of copper. The electrically conductive carrier may include an electrically conductive coating. The carrier may be made from a piece or from two or more pieces. The carrier may include electrically conductive vias, lines pads, for example bond pads, and/or contact areas and a body including an electrically insulating material.

In S4, at least one first chip 18, the first chip 18 including a first side and a second side opposite the first side, may be arranged with its second side on a carrier and may be electrically coupled with the carrier. For example, in S4, the first chip 18 may be electrically contacted with its second side to an electrically conductive carrier. The first chip 18 may be electrically coupled with the carrier by arranging the first chip 18 on the carrier, for example via the second side of the first chip 18, or after arranging the first chip 18 on the carrier, in the latter case for example with the help of wire bonds. The first chip 18 may be contacted with the carrier by soldering, for example by diffusion soldering. In various embodiments there may be two, three or more first chips 18 each including a first side and a second side opposite the first side, wherein the corresponding first chips are arranged on the electrically conductive carrier and are electrically contacted with their corresponding second sides to the electrically conductive carrier.

In S6, an insulating layer, for example the above insulating layer 24, for example the coating, e.g. an electrically insulating coating, is formed over at least a part of the carrier and over at least a part of the first side of the first chip 18 with the coating electrically insulating the coated parts of the carrier and of the first chip 18. The insulating layer 24 or the coating may be formed over the whole first side of the first chip 18. The coating may correspond to the insulating layer 24 explained above. The coating may include an electrically insulating material and/or the coating may consist of an electrically insulating material. The insulating layer 24 may be formed by vapour deposition. The insulating layer 24 may be formed by chemical vapour deposition (CVD), for example the insulating layer 24 may be formed by a CVD-ceramic or by a CVD-polymer. Alternatively, the insulating layer 24 may be formed by physical vapour deposition (PVD). Alternatively, the insulating layer 24 may be formed by spin coating, by sputtering or by pyrolytic deposition, for example from silane and/or silicon dioxide. Alternatively, the insulating layer 24 may be formed by a sinter process or by melting. The insulating material for forming the insulating layer 24 may be in its gaseous phase and/or its liquid phase when the insulating layer 24 is formed. For example, the material of the insulating layer 24 is provided as a solution. The thickness of the insulating layer 24 or the coating over the carrier may be the same, approximately the same, or similar like the thickness of the insulating layer 24 or the coating over the first chip 18.

In S8, at least one second chip 28 is arranged over the insulating layer 24 or the coating. The second chip 28 may be arranged besides the first chip 18 in a direction parallel to the first side of the first chip 18. Alternatively, the second chip 28 may be arranged on the insulation layer 24 or the coating over the first chip 24. The second chip 28 may have a first side of the second chip 28 and a second side of the second chip 28, wherein the second chip 28 may be arranged on the insulating layer 24 or the coating with its second side and wherein the whole second side of the second chip 28 may be in contact with the insulation layer 24 or the coating.

In S10, an encapsulation is formed over the first chip 18 and the second chip 28, for example by arranging the encapsulation material 30 over the chips 18, 28. For example the encapsulation material 30 is brought over the chips 18, 28 in its liquid phase and then the encapsulation material 30 is dried and/or cured. Optionally, a second insulation layer 34 is formed over the first insulating layer 24 or the coating and the second chip 28.

In S12, electrical contacts are formed, for example the above electrical contacts 32. The electrical contacts 32 may be formed by drilling, for example mechanical drilling or laser drilling, holes in the encapsulation such that the electrical contacts 20, 22 of the first chip 10 and the second chip 12 are exposed and by inserting an electrically conductive material into the holes, with the electrically conductive material contacting the electrical contacts 20, 22 of the first chip 10 and the second chip 12. For example, a liquid electrically conductive material is filled in the holes and is then dried or cured.

If the chip packages 10, 12 are formed in a chip package arrangement, the chip packages may be separated from each other in a separation step.

The above chip package 10, 12 may be fowled as a half-bridge circuit and may include the corresponding components, e.g. chips. The half-bridge circuit may be formed over a redistribution layer of the chip package 10, 12. The above chip package 10, 12 may include one, two or more further chips which may be encapsulated by the insulating layer 24, the second insulating layer 34, the encapsulating material 30 and/or further insulating layers or further encapsulating material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of manufacturing a chip package, the method comprising:
    electrically contacting at least one first chip, the first chip comprising a first side and a second side opposite the first side, with its second side to an electrically conductive carrier;
    forming an insulating layer over at least a part of the electrically conductive carrier and over at least a part of the first side of the chip;
    arranging at least one second chip over the insulating layer;
    forming encapsulating material over the first chip and the second chip; and
    forming electrical contacts through the encapsulation material to at least one contact of the at least one first chip and to at least one contact of the at least one second chip, wherein the second chip is arranged next to the first chip.

2. The method according to claim 1,
    wherein the insulating layer is formed over the whole first side of the first chip.

3. The method according to claim 1,
    wherein the whole second chip is arranged over the insulating layer.

4. The method according to claim 1,
    wherein a thickness of the insulating layer over the carrier and a thickness of the insulating layer over the first chip are the same or in a similar range.

5. The method according to claim 1,
    wherein the insulating layer is formed by vapour deposition.

6. The method according to claim 5,
    wherein the insulating layer is formed by chemical vapour deposition.

7. The method according to claim 1,
    wherein the insulating material for forming the insulating layer is in its liquid phase when the insulating layer is formed.

8. The method according to claim 1,
    wherein the insulating material comprises at least one of a ceramic, an inorganic type and a polymer.

9. A method of manufacturing a chip assembly, the method comprising:
    arranging at least one first chip, the first chip comprising a first side and a second side opposite the first side, with its second side on a carrier and electrically coupling the first chip with the carrier;
    forming a coating over at least a part of the carrier and over at least a part of the first side of the first chip with the coating electrically insulating the coated parts of the carrier and of the first chip;
    arranging at least one second chip over the coating;
    forming encapsulating material over the first chip and the second chip; and
    forming electrical contacts through the encapsulation material to at least one contact of the first chip and to at least one contact of the second chip, wherein the second chip is arranged next to the first chip.

10. The method according to claim 9,
    wherein the second chip is arranged besides the first chip in a direction parallel to the first side of the first chip.

* * * * *